(12) United States Patent
Lambrecht et al.

(10) Patent No.: US 8,374,558 B2
(45) Date of Patent: Feb. 12, 2013

(54) ANTENNA ARRAY WITH FLEXIBLE INTERCONNECT FOR A MOBILE WIRELESS DEVICE

(75) Inventors: Frank Lambrecht, Mountain View, CA (US); Luiz M. Franca-Neto, Sunnyvale, CA (US)

(73) Assignee: Rambus Inc., Sunnyvale, CA (US)

( * ) Notice: Subject to any disclaimer, the term of this patent is extended or adjusted under 35 U.S.C. 154(b) by 490 days.

(21) Appl. No.: 12/675,269

(22) PCT Filed: Aug. 22, 2008

(86) PCT No.: PCT/US2008/074016
§ 371 (c)(1),
(2), (4) Date: Feb. 25, 2010

(87) PCT Pub. No.: WO2009/029520
PCT Pub. Date: Mar. 5, 2009

(65) Prior Publication Data
US 2010/0240327 A1    Sep. 23, 2010

Related U.S. Application Data

(60) Provisional application No. 60/966,463, filed on Aug. 27, 2007, provisional application No. 60/999,804, filed on Oct. 19, 2007.

(51) Int. Cl.
*H04B 1/38* (2006.01)
(52) U.S. Cl. .......... 455/90.3; 455/562.1; 455/575.5; 455/575.7; 455/575.1; 343/700 MS; 343/771; 343/912; 343/372; 324/338
(58) Field of Classification Search ............. 455/90.3, 455/562.1, 575.1, 575.5, 575.7; 343/700 MS, 343/771, 912, 372, 373; 324/338
See application file for complete search history.

(56) References Cited

U.S. PATENT DOCUMENTS

| | | | | |
|---|---|---|---|---|
| 5,771,022 | A * | 6/1998 | Vaughan et al. | 343/702 |
| 6,545,643 | B1 * | 4/2003 | Sward et al. | 343/702 |
| 6,768,460 | B2 * | 7/2004 | Hoashi et al. | 343/700 MS |
| 6,873,293 | B2 * | 3/2005 | Proctor et al. | 343/725 |
| 6,956,537 | B2 * | 10/2005 | Scherzer et al. | 343/853 |
| 7,034,759 | B2 * | 4/2006 | Proctor et al. | 343/725 |
| 7,180,464 | B2 * | 2/2007 | Chiang et al. | 343/833 |
| 7,215,290 | B2 * | 5/2007 | Cohen | 343/702 |
| 7,272,359 | B2 * | 9/2007 | Li et al. | 455/67.13 |

(Continued)

FOREIGN PATENT DOCUMENTS

| | | |
|---|---|---|
| EP | 1526603 A1 | 4/2005 |
| JP | 2000-209013 | 7/2000 |

(Continued)

OTHER PUBLICATIONS

Notification Concerning Transmittal of International Preliminary Report on Patentability (Chapter I) with mail date of Mar. 11, 2010, re International Application No. PCT/US2008/074016. 8 pages.

(Continued)

*Primary Examiner* — Marceau Milord
(74) *Attorney, Agent, or Firm* — Barcelo, Harrison & Walker LLP (57) ABSTRACT

An antenna array can be mounted on a flexible substrate and connected by a flexible interconnect to an integrated circuit such as a radio frequency front end. The antenna array can be mounted in a device housing that includes radio frequency interference (RFI) shielding. The antenna array is aligned with and next to an area of the housing that is not shielded against RFI.

12 Claims, 7 Drawing Sheets

U.S. PATENT DOCUMENTS

| | | | |
|---|---|---|---|
| 7,321,636 B2 * | 1/2008 | Harel et al. | 375/299 |
| 7,405,697 B2 * | 7/2008 | Ying | 343/700 MS |
| 7,424,308 B2 * | 9/2008 | Suzuki | 455/552.1 |
| 7,453,405 B2 * | 11/2008 | Nishikido et al. | 343/702 |
| 7,639,188 B2 * | 12/2009 | Ying et al. | 343/702 |
| 7,705,798 B2 * | 4/2010 | Cohen | 343/846 |
| 7,764,232 B2 * | 7/2010 | Achour et al. | 343/700 MS |
| 7,792,207 B2 * | 9/2010 | Harel et al. | 375/267 |
| 7,859,470 B2 * | 12/2010 | Johnson | 343/702 |
| 7,999,754 B2 * | 8/2011 | Cohen | 343/846 |
| 8,130,160 B2 * | 3/2012 | Burns et al. | 343/755 |
| 2004/0046694 A1 | 3/2004 | Chiang et al. | 342/360 |
| 2005/0062649 A1 | 3/2005 | Chiang | |
| 2006/0164308 A1 | 7/2006 | Cohen | |
| 2006/0211374 A1 | 9/2006 | Proctor, Jr. | |
| 2009/0051597 A1 | 2/2009 | Wen et al. | 343/700 |

FOREIGN PATENT DOCUMENTS

| | | |
|---|---|---|
| JP | 2003-0078320 | 3/2003 |
| WO | 9917396 A1 | 4/1999 |
| WO | 0115270 A1 | 3/2001 |

OTHER PUBLICATIONS

EP Office Action dated Mar. 22, 2011 re Communication for EP Application No. 08828554.9. 5 pages.
EP Response dated Jul. 18, 2011 to the Official Communication dated Mar. 22, 2011 re EP Application No. 08828554.9. 15 pages.
JP Office Action dated Dec. 13, 2011 re JP Application No. 2010-523058. 7 pages.
CN First Office Action dated Jun. 4, 2012 in CN Application No. 200880109742.0. 22 pages.

* cited by examiner

610
MONITOR A FIRST METRIC FOR SIGNALS
RECEIVED VIA A FIRST ANTENNA ARRAY

620
MONITOR A SECOND METRIC FOR SIGNALS
RECEIVED VIA A SECOND ANTENNA ARRAY

630
COMPARE THE FIRST AND SECOND METRICS
TO DETERMINE WHICH ANTENNA ARRAY IS
RECEIVING THE STRONGEST SIGNAL

ANTENNA ARRAY WITH FLEXIBLE INTERCONNECT FOR A MOBILE WIRELESS DEVICE

BACKGROUND

Contemporary wireless networks send and receive signals using frequency bands such as the 2.4 gigahertz (GHz) band or the 5.8 GHz band. Public demand for high bandwidth multimedia applications is growing, and eventually that demand may exceed the amount of bandwidth available in the commonly used frequency bands.

Accordingly, a device and/or method that permits the use of the 60 GHz band for wireless communication would have value.

BRIEF DESCRIPTION OF THE DRAWINGS

The accompanying drawings, that are incorporated in and form a part of this specification, illustrate embodiments discussed below, and, together with the description, serve to explain the principles of the disclosure.

DETAILED DESCRIPTION

Figure 1:
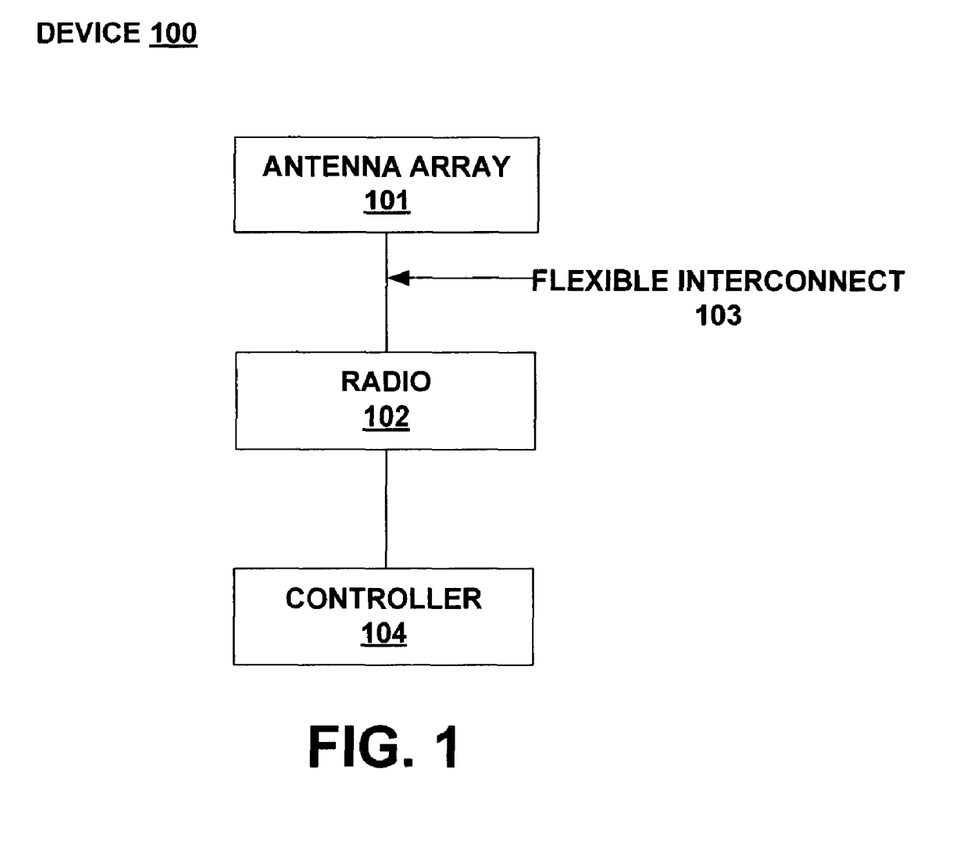
FIG. 1 is a block diagram showing elements of an electronic device.

FIG. 1 is a block diagram showing certain elements of an electronic device 100, in particular an electronic device that is suited for sending and receiving RF signals. The device 100 may be, for example, a computing device (e.g., desktop computer, laptop computer, or notebook computer), a handheld or wireless mobile device (e.g., cell phone, smart phone, cordless phone, music player, personal digital assistant, game player, or camera), a peripheral device (e.g., keyboard, mouse, router), or some other type of consumer electronic device (e.g., a set top box, digital versatile disk player, digital video recorder). In one embodiment, the RF signals include signals in the frequency spectrum referred to as the 60 GHz band (e.g., between about 57 and 64 GHz).

In the example of FIG. 1, the device 100 includes an antenna array 101 connected to a radio 102 by a flexible interconnect or connector 103. Other components, such as a controller 104 (e.g., a central processing unit or microprocessor) may be coupled to the radio 102. The device 100 may include other elements in addition to those shown in FIG. 1 or described below, depending on what type of device it is and what type of functionality it provides. Furthermore, as will be seen, the device 100 may include more than one antenna array.

In one embodiment, the radio 102 includes an RF front end that down-converts RF signals received by the antenna array 101 into baseband signals, and up-converts baseband signals into RF signals that can be transmitted via the antenna array 101. If the device 100 includes multiple antenna arrays, it may also include multiple RF front ends. If so, each RF front end can be located near a respective antenna array and connected to, for example, the radio 102 via either its own respective flexible interconnect 103 or a flexible interconnect that is shared with other RF front ends.

The flexible interconnect 103 may be a coplanar ground-signal-ground (GSG) interconnect (for monopole antennas) or a coplanar ground-signal-signal-ground (GSSG) interconnect (for dipole antennas). Alternatively, the flexible interconnect 103 may be a dielectric waveguide, a substrate integrated waveguide, or a substrate integrated slab waveguide. In general, the flexible interconnect 103 has the properties of controlled impedance and low loss tangent. The flexible interconnect 103 may be formed of a polyimide tape. The use of a flexible interconnect 103 allows the antenna array 101 to be placed at various, advantageous locations in or on device 100 (see FIG. 4, for example).

Generally speaking, the antenna array 101 of FIG. 1 is a phased array antenna. The antenna array 101 may be an array of monopole antennas or an array of dipole antennas, or a combination thereof. In one embodiment, the antenna array 101 is implemented as a microwave patch antenna that is coupled to the flexible interconnect 103. In another embodiment, the antenna array 101 is mounted on a flexible substrate, which in turn can be coupled to the radio 102 via the flexible interconnect 103. Alternatively, the flexible substrate on which the antenna array is mounted may itself be long enough so that the flexible substrate can be used to connect the antenna array 101 and the radio 102.

Figure 2:
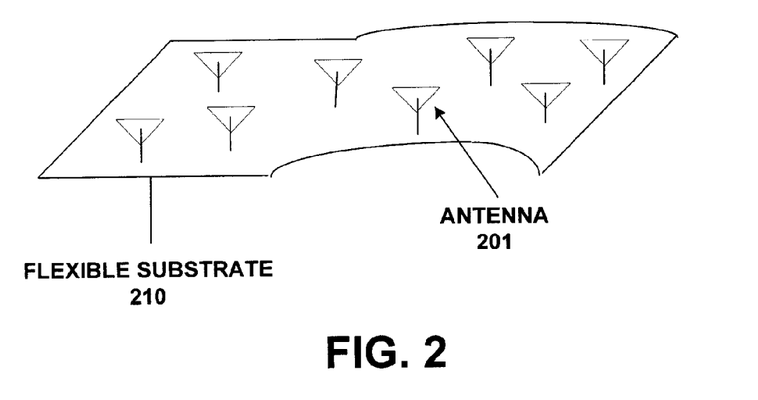
FIG. 2 illustrates an example of an antenna array mounted on a flexible substrate.

FIG. 2 is an example of an array 101 of antennas (exemplified by an antenna 201) mounted on a flexible substrate 210, such as a polyamide tape substrate. As such, the antenna array 101 can conform to the shape of the surface on which it is mounted. This gives designers more choices with regard to where to locate the antenna array on a device, without having to change the form factor of the device to accommodate the antenna array. However, the antenna array 101 may instead be mounted on a rigid substrate.

Figure 3:
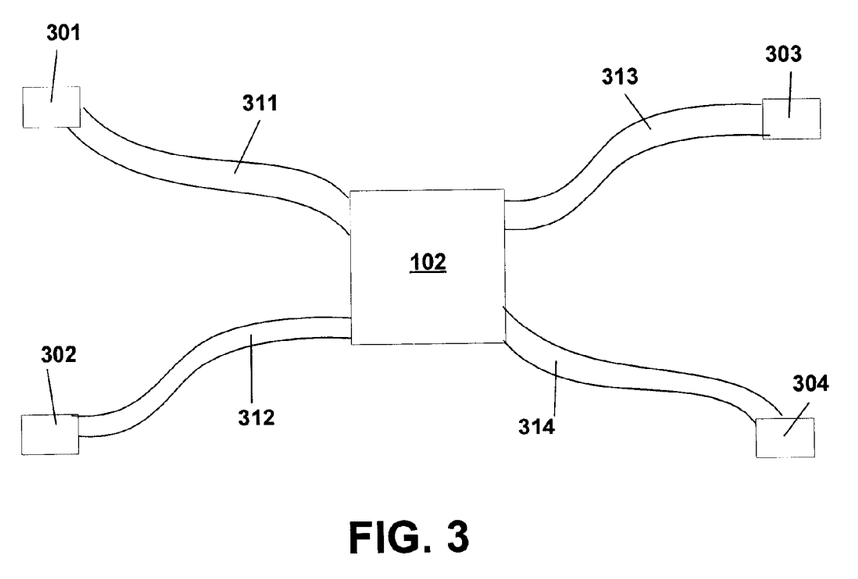
FIG. 3 illustrates an example of multiple antenna arrays coupled to a chip by a number of flexible interconnects.

FIG. 3 illustrates an embodiment in which multiple antenna arrays 301, 302, 303 and 304 (301-304) are coupled to a chip (e.g., the radio 102 or an RF front end) by respective flexible interconnects 311, 312, 313 and 314 (311-314). The antenna arrays 301-304 are analogous to the antenna array 101 of FIGS. 1 and 2. Although four (4) antenna arrays and interconnects are described, a different number of arrays and interconnects can be used. It is also not necessary that the number of antenna arrays and the number of flexible interconnects be the same; see FIG. 7A, for example.

Continuing with reference to FIG. 3, the radio 102 can be mounted on a printed circuit board (see FIG. 4), while the antenna arrays 301-304 and the flexible interconnects 311-314 can be mounted off the printed circuit board. More specifically, the antenna arrays can be mounted proximate to the surface of a device housing, making use of space that otherwise might not be used, while the flexible interconnects can be routed along the inside surfaces of the housing or through free space inside the housing. This minimizes the footprint of the printed circuit board, enabling further miniaturization of the wireless device.

Figure 4:
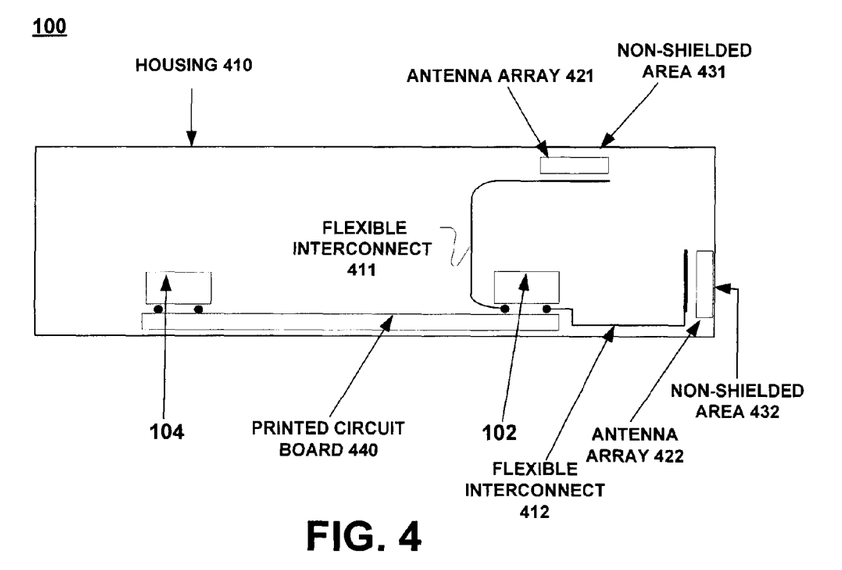
FIG. 4 is a cross-sectional view of an electronic device and illustrates an example of an arrangement of antenna arrays and flexible interconnects.

FIG. 4 is a cross-sectional view of a device 100, showing a first antenna array 421 and a second antenna array 422 mounted within a housing 410 of the device. Although two antenna arrays are mentioned in this example, as well as in other examples herein, a different number of antenna arrays can be utilized.

To reduce or eliminate electromagnetic interference (EMI), including radio frequency interference (RFI), the housing 410 may be made of material (e.g., a conductive metal) that shields against RFI. Alternatively, the housing 410 may be made of a suitable material (e.g., a polymer) that is coated with RFI shielding material (e.g., a conductive paint). In one embodiment, the housing 410 includes areas on the surface that are transparent to RFI, such as the areas 431 and 432. The transparent areas 431 and 432 may be implemented in a variety of ways. For instance, the transparent areas 431 and 432 may be made of material that does not shield against RFI while the remainder of the housing 410 is made of material that does shield against RFI. The non-shielded areas 431 and 432 may instead be areas that are not coated with RFI shielding material while the remainder of the housing is coated with RFI shielding material. The non-shielded areas 431 and 432 may simply be openings in the housing 410.

In the example of FIG. 4, the first antenna array 421 is disposed proximate (e.g., aligned with and adjacent to) the first non-shielded area 431, such that the antenna array forms a substantially conformal relationship with that portion of the housing. Similarly, the second antenna array 422 is disposed proximate (e.g., aligned with and adjacent to) the second non-shielded area 432. The antenna arrays may be held in place by an adhesive (e.g., an epoxy), by mechanical means (e.g., a clip, as in FIG. 8), or by some other suitable means. As mentioned above, in one embodiment, the antenna arrays 421 and 422 can be mounted on a flexible substrate, in which case the antenna arrays can be made to even more fully conform to the shape of the housing 410 (specifically, to the shapes of the non-shielded areas 431 and 432). Although a relatively flat surface is shown in the example of FIG. 4, the housing 410 is not so limited in shape.

In the example of FIG. 4, a radio 102 is mounted on a chip substrate such as a printed circuit board 440. The first antenna array 421 is connected to the radio 102 using a first flexible interconnect 411, and the second antenna array 422 is connected to the radio 102 using a second flexible interconnect 412. That is, the antenna arrays are separately connected to the radio 102 using individual, respective flexible interconnects. The flexible interconnects 411 and 412 can be routed in various ways within the housing 410. For example, the flexible interconnects 411 and 412 can be routed along the inside surfaces of the housing 410, leaving the interior volume of the housing free for other components. Alternatively, a designer can place other components at favorable locations within the housing 410, and the flexible interconnects 411 and 412 can be routed in free space around those components. The flexible interconnects 411 and 412 can, at least to some extent, share the same routing path. In other words, the flexible interconnects 411 and 412 can be stacked or layered against each other (routed in parallel to each other). In any case, the flexible interconnects 411 and 412 can be fastened to the housing 410, or to components within the housing 410, to keep them in place and prevent them from moving (e.g., flapping) as the result of cooling air flow, for example. Rigid material can be affixed to portions of the flexible interconnects to provide them with stiffness where necessary, perhaps to facilitate handling during device manufacture, without sacrificing the flexibility that allows the interconnects to be routed as needed or desired.

As will be described in conjunction with FIG. 8 below, the antenna arrays 421 and 422 can be backed with RFI shielding material. The antenna arrays 421 and 422 can also be mounted flush against the housing 410 and sealed along their edges with RFI shielding. As such, the first and second arrays 421 and 422 are implemented without compromising the integrity of the RFI shielding provided by the housing 410.

In addition, because the antenna arrays 421 and 422 are located close to the non-shielded areas 431 and 432, their respective tuning ranges can be broadened—the smaller the distance between the antenna arrays 421 and 422 and the areas 431 and 432, the larger the tuning range. Furthermore, by locating the antenna arrays 421 and 422 close to the non-shielded areas, the possibility that some portion of transmitted signals may be reflected by the housing 410 back into the device 100, or the possibility that some portion of received signals may scatter into the device 100, is reduced if not eliminated.

In the example of FIG. 4, the first and second arrays 421 and 422 lie in different planes on the surface of housing 410. Based on the orientation of the device 100 in FIG. 4, the first array 421 is located on the top surface of the housing 410, while the second array 422 is located on a surface orthogonal to the top surface. Other arrangements are possible—that is, an antenna array can be placed against any surface of the housing 410. Also, some types of devices, such as cell phones, include two components that are joined by a hinge or the like. Generally speaking, those types of devices consist of two housings that are mechanically joined. In such devices, antenna arrays can be located in either or both housings; an antenna array in one housing can be connected to an RF front end or radio in the other housing a flexible interconnect, such as that described herein, that passes through the joint of the two housings.

Figure 5:
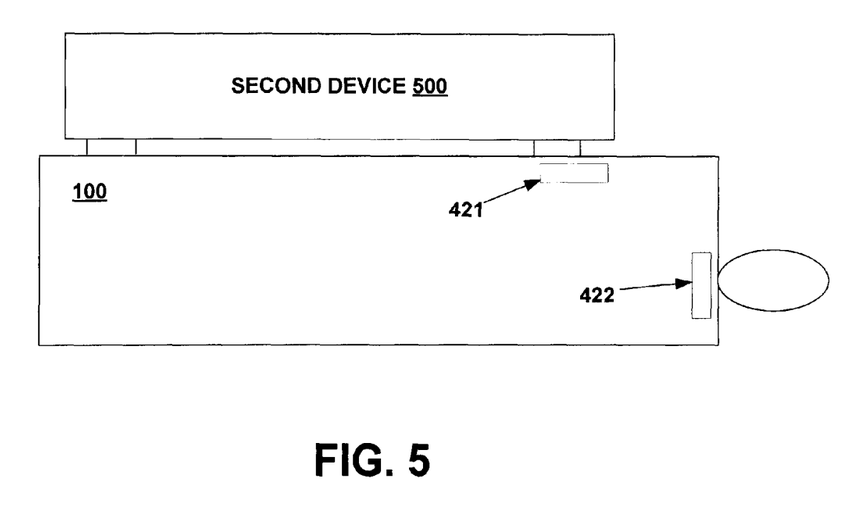
FIG. 5 illustrates two stacked devices.

FIG. 5 shows a second device 500 stacked on top of the device 100 (which is shown in cross-sectional view). Even though the first antenna array 421 is obstructed by the device 500, the second antenna array 422 remains unobstructed and can be used to send and receive signals.

Thus, placement of antennas on different surfaces provides users with more flexibility when arranging devices in a room or on a shelf, for example. This can be particularly important when higher frequency bands, such as the 60 GHz band, are used. Higher frequency signals are transmitted in a narrower beam than lower frequency signals, and beams associated with higher frequency bands are more directional than beams associated with lower frequency bands. Therefore, when higher frequency bands are used, it is more important to generally align the antennas on the sending and receiving devices. If at least one of the devices has more than one antenna, then it is easier to arrange that device so that the antennas are generally aligned. Furthermore, the directional steering capability of a phased array antenna (such as the antenna arrays 421 and 422) facilitates proper alignment of an antenna.

An antenna array may be blocked by something other than another device. As described more fully below, one antenna array can be selected over another antenna array to send or receive signals. Thus, should one antenna array become obstructed for some reason after the device 100 is placed, another antenna array can be used in lieu of the obstructed array even if, for example, the obstruction is only temporary.

Figure 6:
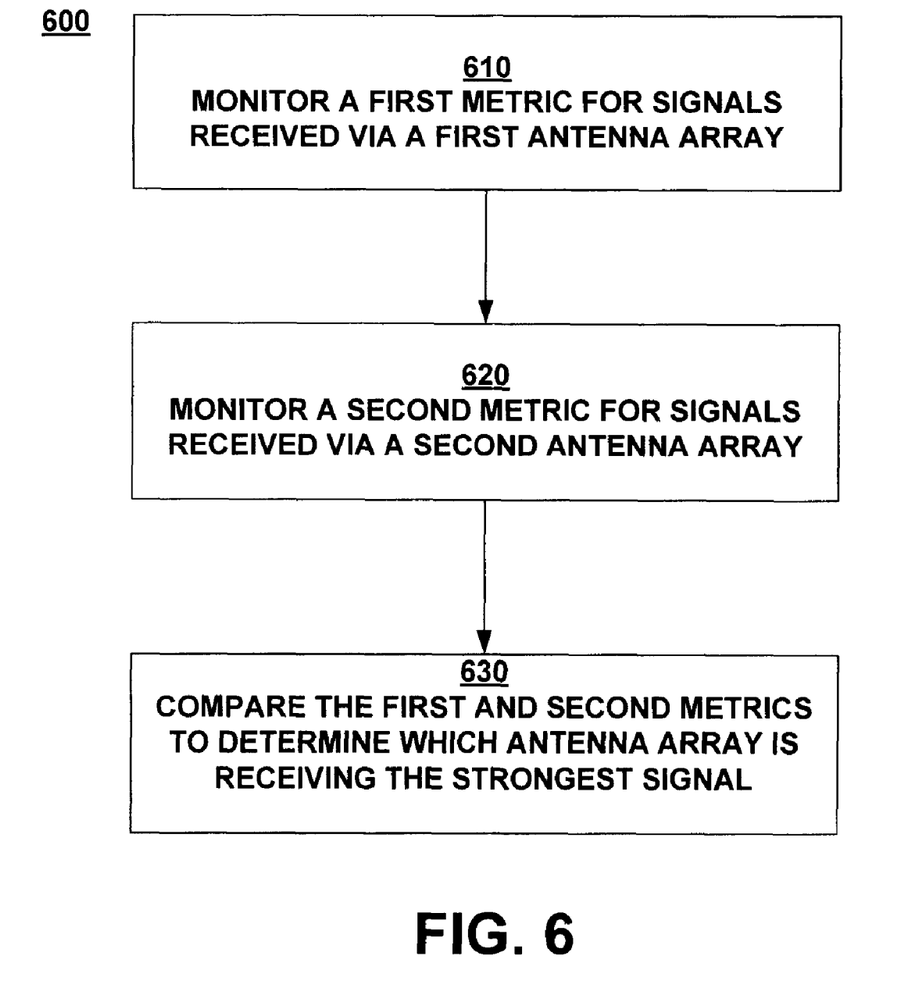
FIG. 6 is a flowchart of a method for choosing between multiple antenna arrays.

In general, the antenna array that is best able to send and/or receive signals can be selected (either manually or automatically) if the performance of another antenna array is adversely affected by some type of obstruction (please refer to the discussion of FIG. 6, below).

With reference again to FIG. 4, any combination of one or more of the antenna arrays 421 and 422 can be used to send signals, and any combination of one or more of the antenna arrays 421 and 422 can be used to receive signals (as noted above, there may be more than two antenna arrays per device). It may be advantageous to receive signals using more than one of the antenna arrays 421 and 422 (FIG. 4), even if the signal received via one antenna array is stronger than the signal received via another antenna array (signal strength may be measured using signal-to-noise ratio, signal power level, packet loss rate, or other well known metrics). The weaker signal can be used to supplement the stronger signal, for example in applications such as forward error correction schemes that rely on data redundancy to detect and correct errors in a signal. Use of the weaker signal to supplement the stronger signal may also prove useful because a packet that may be missing or corrupted in one beam may be correctly received in another beam.

Conversely, it may be advantageous to send signals using only one of the antenna arrays 421 or 422. For example, the amount of signal energy that can be transmitted may be limited (e.g., by government or industry standards), and so it may be better to utilize that energy in one beam (from one antenna array) rather than distribute that energy across multiple beams sent using multiple antenna arrays.

In one embodiment, the device 100 includes the intelligence (e.g., the controller 104 of FIG. 1) to automatically select one antenna array over another to send signals and/or receive signals. FIG. 6 is a flowchart 600 of one embodiment of a method for selecting one antenna array over another. Although specific steps are disclosed in the flowchart 600, such steps are exemplary. That is, various other steps or variations of the steps recited in the flowchart 600 may be performed, and the steps in the flowchart 600 may be performed in an order different than presented. The flowchart 600 is described with reference to both FIG. 6 and FIG. 4.

In block 610, a device 100 collects and monitors one or more metrics associated with RF signals that are being received at the device 100 from another (second device) via a first antenna array 421. In general, the device 100 can monitor the quality of the incoming signals in terms of signal strength. For example, the device 100 can monitor signal-to-noise-ratio (SNR), packet error loss rate, and/or the power level of the incoming signal.

In block 620, the device 100 also collects and monitors one or more metrics associated with RF signals that are being received at the device 100 from another (second device) via a second antenna array 422. If there are more than two antenna arrays, then the device 100 can also collect and monitor one or more metrics associated with RF signals received via each array.

In block 630, the metrics associated with the signals received via the various antenna arrays are compared to identify which of the antenna arrays is receiving the strongest signals.

Based on the comparison, a decision can be made whether to rely on both (all) antenna arrays, a single antenna array, or some number of antenna arrays in between to receive signals. On the one hand, as mentioned above, it may be beneficial to continue to receive signals via more than one antenna array regardless of the relative performances of the antenna arrays, because even a weaker signal may prove useful. On the other hand, it may be beneficial to rely on only one of the antenna arrays—that is, although all antenna arrays may continue to receive a broadcast signal, only the strongest set of signals may be processed—in order to save power or simplify signal processing, for example.

The number of antenna arrays used for sending signals may be different than the number of antenna arrays used for receiving signals. As mentioned above, there may be an advantage to sending signals via a single antenna array. Although the metrics referred to above are collected based on incoming signals, those metrics can be used to select an antenna array for sending signals.

Metrics can be collected periodically or continuously, so that any changes in the relative performance of the antenna arrays can be detected. In general, the process of monitoring antenna performance is a dynamic one, and the decision with regard to which antenna array or arrays to rely on (for sending and/or receiving) can change over time.

Figure 7A:
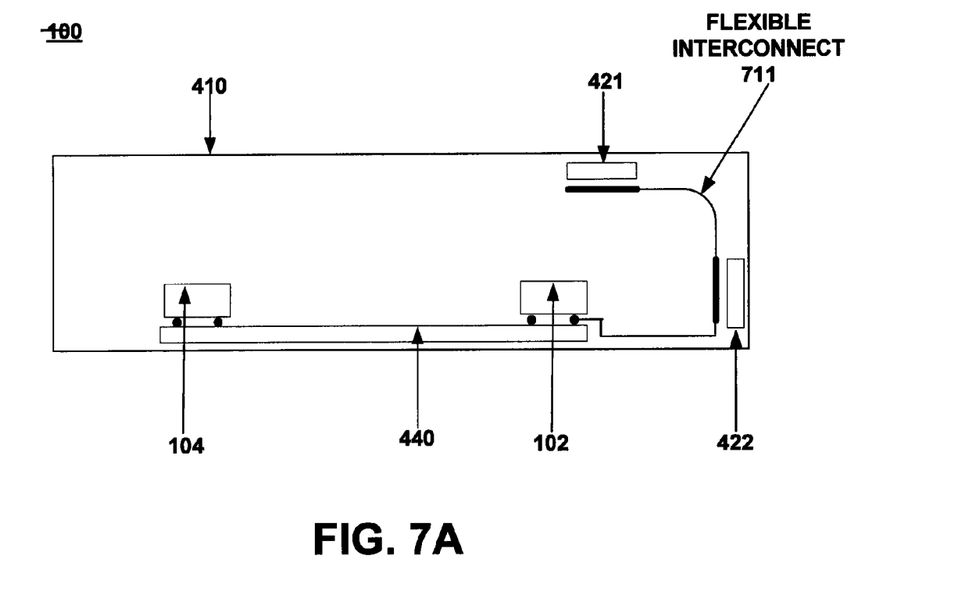
FIG. 7A is a cross-sectional view of an electronic device and illustrates an example of an arrangement of antenna arrays and a flexible interconnect.

FIG. 7A is a cross-sectional view of a device 100, but in this example, the first and second antenna arrays 421 and 422 are connected to the radio 102 (which is mounted on a printed circuit board 440, along with a controller 104) by a single, shared flexible interconnect 711. The first and second antenna arrays 421 and 422 do not necessarily share the same wiring or traces within the flexible interconnect 711—the wiring for each of the antenna arrays is instead routed using a single flexible interconnect. As in the example of FIG. 4, the flexible interconnect 711 can be routed around the edges of the housing or through the interior volume of the device 100, around other device components.

Figure 7B:
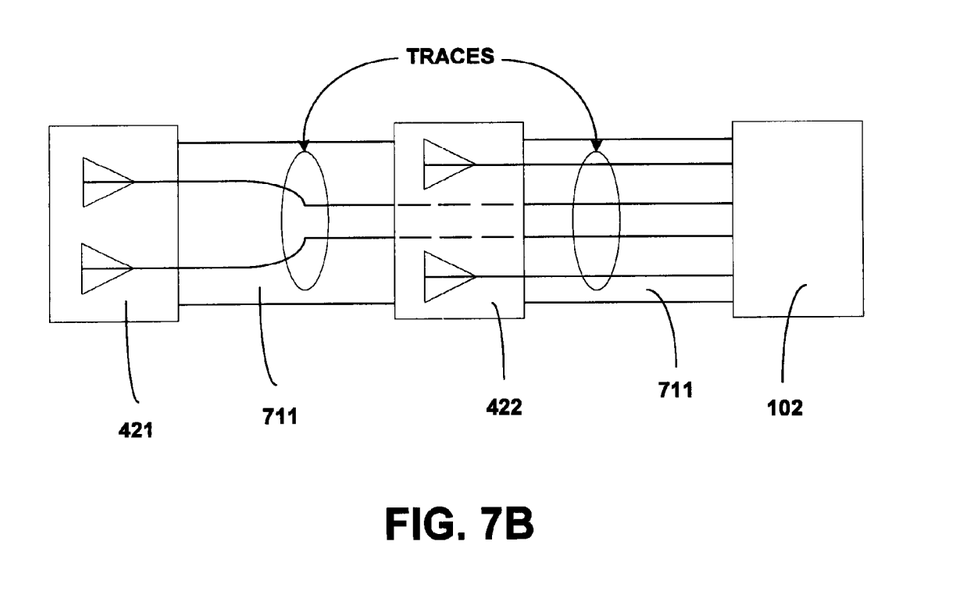
FIG. 7B illustrates a single flexible interconnect that connects two antenna arrays.

FIG. 7B is a top-down view of one embodiment of a single flexible interconnect 711 that connects the two antenna arrays 421 and 422. In the example of FIG. 7B, the traces that connect the antenna array 421 to the radio 102 pass underneath the antenna array 422.

Figure 8:
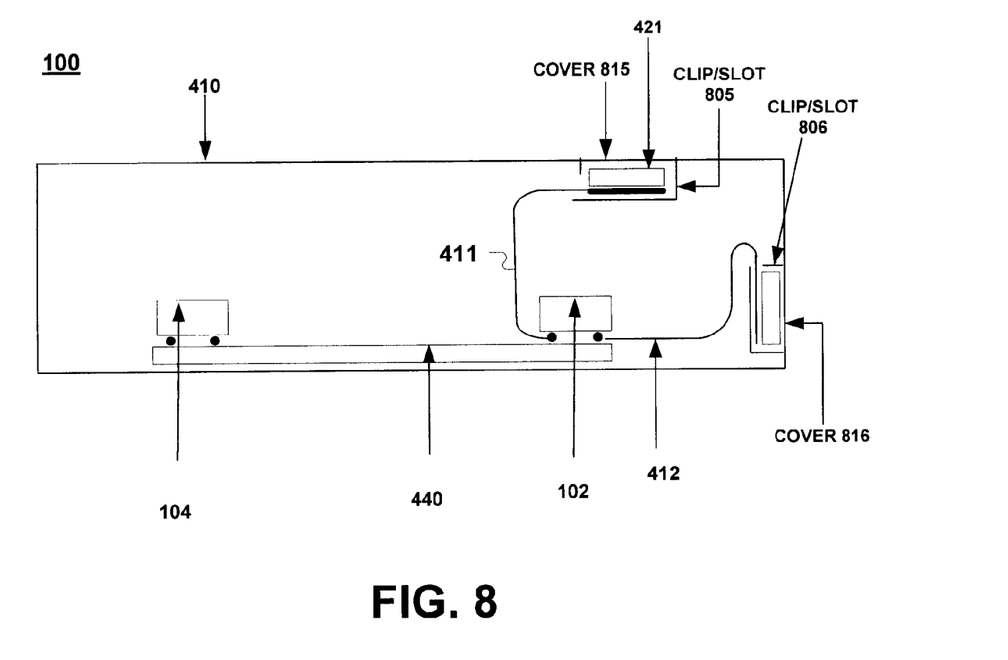
FIG. 8 is a cross-sectional view of an electronic device and illustrates another example of an arrangement of antenna arrays and flexible interconnects.

FIG. 8 is a cross-sectional view of a device 100, but in this example, the first and second antenna arrays 421 and 422 are held securely in place by nesting them into outwardly opening receptacles 805 and 806 (or the like) formed as depressions or indentations in the housing 410. In this arrangement, the receptacles 805 and 806 not only provide structural support for the antenna arrays 421 and 422, but also shield internal components against RFI. The arrays may be coated or covered by plastic or another suitable material (covers 815 and 816) such that the top of the receptacle/array lies flush with the exterior surface of the housing. Also, in this arrangement the antenna arrays 421 and 422 are separated from the interior of the housing 410 by RFI shielding material; the flexible interconnects 411 and 412 can pass through narrow openings in the receptacles 805 and 806 so that the integrity of the RFI shielding is not compromised.

Figure 9:
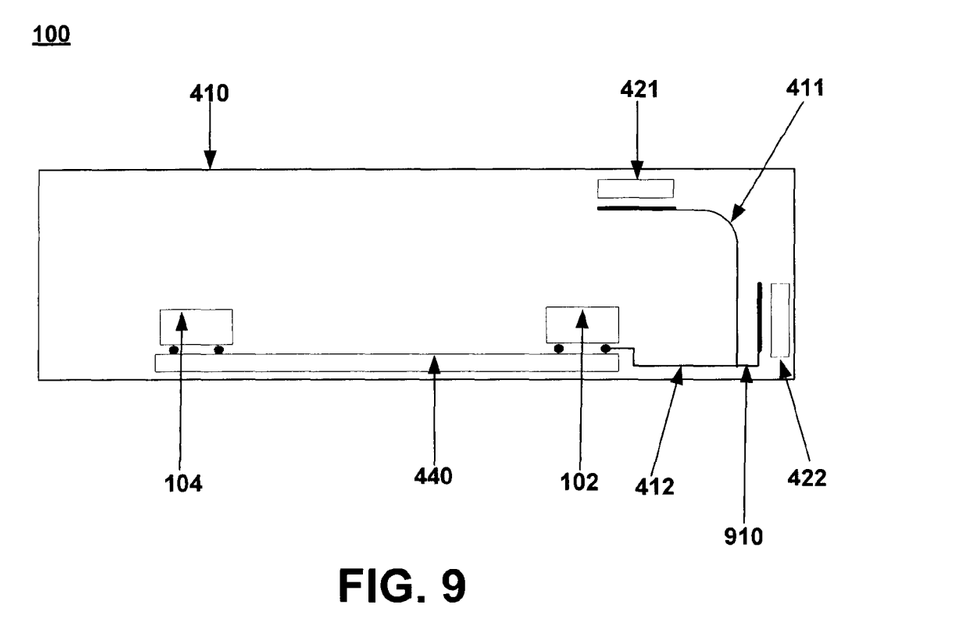
FIG. 9 is a cross-sectional view of an electronic device and illustrates yet another example of an arrangement of antenna arrays and flexible interconnects.

FIG. 9 is a cross-sectional view of a device 100, but in this example, a flexible interconnect 411 is connected at one end to a flexible interconnect 412, such that a signal from the second antenna array 421 traverses both the flexible interconnect 411 and at least a portion of the flexible interconnect 412. The antenna arrays 421 and 422 lie on the same routing path (like in the example of FIG. 7A), but in effect antenna array 422 is coupled to that routing path by a short length 910 of flexible interconnect. Additional antenna arrays (not shown) can be coupled to a radio 102 in a similar manner; that is, in effect, each succeeding antenna array is coupled to by a flexible interconnect that is connected to the flexible interconnect of the preceding antenna array. Use of flexible interconnects in the manner illustrated in FIG. 9 provides the antenna arrays with additional freedom of movement that may prove useful during design or manufacture.

Alternately, the various antenna arrays can be connected to the radio 102 using a single flexible interconnect that branches to each of the antenna arrays. In another embodiment, multiple flexible interconnects of different lengths and coupled to different pins on the radio 102 can be layered on top of one another up to the various points at which the different lengths branch off to one of the antenna arrays. In other words, extending from the radio 102, each of the different lengths of flexible interconnects are layered on top of each other up to the first point at which one of the lengths branches off to an antenna array; the interconnects continue in layered fashion to the next point where another one of the lengths branches off, and so on.

Figure 10:
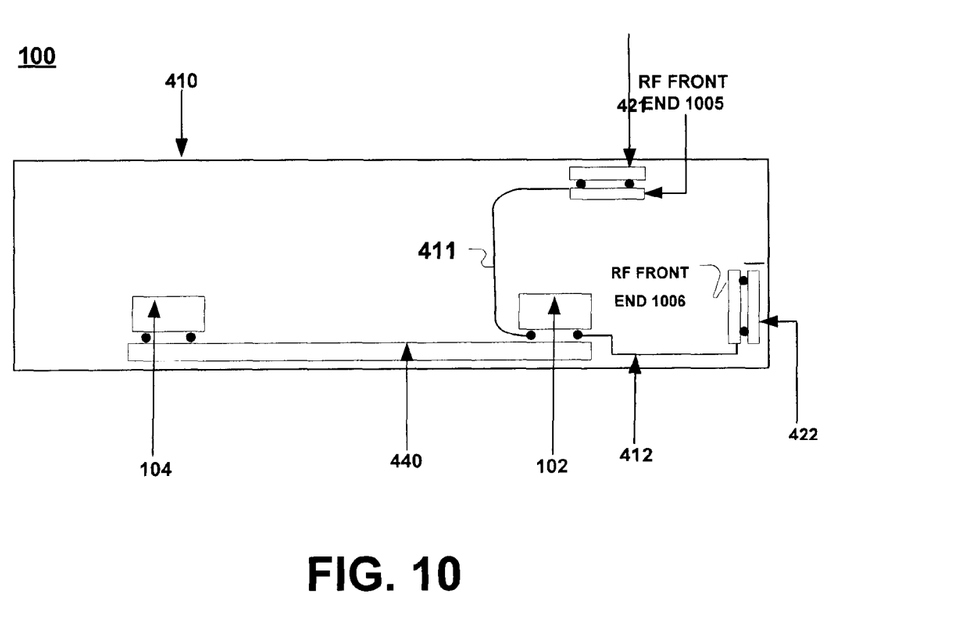
FIG. 10 is a cross-sectional view of an electronic device and illustrates an example of an arrangement of antenna arrays, radio frequency (RF) front ends, and flexible interconnects.

FIG. 10 is a cross-sectional view of a device 100, but in this example, RF front ends 1005 and 1006 are located in proximity to the first and second antenna arrays 421 and 422, respectively. The RF front ends 1005 and 1006 can be connected to the antenna arrays 421 and 422 using connectors in addition to the flexible interconnects 411 and 412 that are used to connect the RF front ends to the radio 102. Alternatively, the RF front ends 1005 and 1006 can be mounted on the same substrate on which the antennas are mounted, or the RF front ends 1005, 1006 and antenna arrays 421 and 422 can be packaged in a stacked arrangement as illustrated in FIG. 10. In such an embodiment, the antenna arrays can be implemented as chip-size packages (CSPs) in silicon.

In the example of FIG. 10, the RF front ends 1005 and 1006 are connected to the radio 102 using flexible interconnects 411 and 412 in the manner described in conjunction with FIG. 4. However, the RF front ends 1005 and 1006 can be connected to the radio 102 in other ways, such as those described above in conjunction with FIGS. 7A and 9.

By placing the RF front ends 1005 and 1006 in proximity to the antenna arrays 421 and 422, then while receiving, higher frequency (e.g., 60 GHz) RF signals travel only a relatively short distance before they are down-converted to lower frequency baseband signals by an RF front end, and while transmitting, RF signals again travel only a relatively short distance after they are up-converted from baseband signals. Accordingly, the length of the path that may be a source of high frequency noise is reduced.

In summary, according to the various embodiments described herein, a higher frequency band (e.g., the 60 GHz band) can be used for wireless communication in a manner that is friendly to consumers and also friendly to small form factor devices. For example, antenna arrays can be located proximate to (e.g., at or on) the surface of a device housing. By locating the antenna arrays remote from the radio (i.e., away from the printed circuit board), the amount of board real estate used by the arrays can be reduced without having to reduce the sizes of the arrays. By locating the antenna arrays proximate to (e.g., at or on) the device housing, RFI shielding is maintained without affecting antenna performance; indeed, the tuning range of the antennas is increased. The antenna arrays can be mounted on a flexible substrate so that they conform to the shape of the device housing. By using multiple antenna arrays, consumers are not limited in how they can arrange their devices (e.g., in a room or on a shelf). Furthermore, by providing the intelligence to automatically determine which antenna array should be used, consumers do not need to be troubled with having to select one antenna array versus another.

In the foregoing specification, embodiments of the claimed subject matter have been described with reference to numerous specific details that can vary from implementation to implementation. Thus, the sole and exclusive indicator of what is, and is intended by the applicants to be the claimed subject matter is the set of claims that issue from this application, in the specific form in which such claims issue, including any subsequent correction. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method of controlling a mobile device comprising a radio frequency (RF) front end coupled to multiple antenna arrays, the method comprising:
    monitoring a first metric associated with RF signals that are communicated between the mobile device and a second device using a first array of antennas that is aligned with and next to a first area on a surface of the mobile device, wherein the first area is not shielded against RF interference (RFI);
    monitoring a second metric associated with RF signals that are communicated between the mobile device and the second device using a second array of antennas that is aligned with and next to a second area on a surface of the mobile device, wherein the second area is not shielded against RFI; and
    comparing the first and second metrics to select one of the first and second arrays for subsequent communication of RF signals between the mobile device and the second device.

2. The method of claim 1 wherein the first array is coupled to the RF front end via a first flexible interconnect.

3. The method of claim 2 wherein the first flexible interconnect also couples the second array to the RF front end.

4. The method of claim 2 wherein the second array is coupled to the RF front end via a second flexible interconnect.

5. The method of claim 2 wherein a portion of the first flexible interconnect is affixed to a rigid support.

6. The method of claim 1 wherein the first and second arrays are held in place by respective fastening elements that provide RFI shielding.

7. A mobile wireless device comprising:
    a radio frequency (RF) front end;
    a first array of antennas coupled to the RF front end, the first array of antennas aligned with and next to a first area on a surface of the mobile device, wherein the first area is not shielded against RF interference (RFI);
    a second array of antennas coupled to the RF front end, the second array of antennas aligned with and next to a second area on a surface of the mobile device, wherein the second area is not shielded against RFI; and
    a controller for:
        monitoring a first metric associated with RF signals that are communicated between the mobile device and a second device using the first array of antennas,
        monitoring a second metric associated with RF signals that are communicated between the mobile device and the second device using the second array of antennas, and
        comparing the first and second metrics to select one of the first and second arrays for subsequent communication of RF signals between the mobile device and the second device.

8. The device of claim 7, further comprising a first flexible interconnect to couple the first array of antennas to the RF front end.

9. The device of claim 8, wherein the first flexible interconnect couples the second array of antennas to the RF front end.

10. The device of claim 8, further comprising a second flexible interconnect to couple second array of antennas to the RF front end.

11. The device of claim 8, further comprising a rigid support affixed to at least a portion of the first flexible interconnect.

12. The device of claim 7, further comprising fastening elements that provide RFI shielding to hold the first and second arrays respectively in place.

* * * * *